US006697412B2

(12) United States Patent
Beam, III et al.

(10) Patent No.: US 6,697,412 B2
(45) Date of Patent: Feb. 24, 2004

(54) LONG WAVELENGTH LASER DIODES ON METAMORPHIC BUFFER MODIFIED GALLIUM ARSENIDE WAFERS

(75) Inventors: Edward A. Beam, III, Plano, TX (US); Gary A. Evans, Plano, TX (US); Paul Saunier, Addison, TX (US); Ming-Yih Kao, Dallas, TX (US); David M. Fanning, Garland, TX (US); William H. Davenport, Hillsboro, OR (US); Andy Turudic, Hillsboro, OR (US); Walter A. Wohlmuth, Hillsboro, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 20 days.

(21) Appl. No.: 09/834,832

(22) Filed: Apr. 13, 2001

(65) Prior Publication Data

US 2002/0150137 A1 Oct. 17, 2002

(51) Int. Cl.$^7$ ............................................. H01S 5/183
(52) U.S. Cl. ........................ 372/96; 257/190; 372/45
(58) Field of Search ...................... 372/45, 96; 257/190

(56) References Cited

U.S. PATENT DOCUMENTS

| 5,633,516 A | * | 5/1997 | Mishima et al. ............. 257/190 |
| 5,770,868 A | | 6/1998 | Gill et al. ..................... 257/190 |
| 5,978,398 A | | 11/1999 | Ramdani et al. .............. 372/45 |
| 5,991,326 A | | 11/1999 | Yuen et al. .................... 372/96 |
| 6,052,398 A | | 4/2000 | Brillouet et al. .............. 372/46 |

OTHER PUBLICATIONS

Kurt Eisenbeiser et al., "Metamorphic InAl As/InGaAs Enhancement Mode HEMT's On GaAs Substrates", IEEE Electron Device Letters, vol. 20, No. 10, Oct. 1999, pp. 507–509.

C. S. Whelan et al., "Low Noise $In_{0.32}(AlGa)_{0.68}As/In_{0.43}Ga_{0.57}As$ Metamorphic HEMT On GaAs Substrate With 850 mW/mm Output Power Density", IEEE Electron Device Letters, vol. 21, No. 1, Jan. 2000, pp. 5–8.

S. Bollaert et al. "Metamorphic $In_{0.4}Al_{0.6}As/In_{0.4}Ga_{0.6}As$ HEMT's On GaAs Substrate", IEEE Electron Device Letters, vol. 20, No. 3, Mar. 1999, pp. 123–125.

D. Lubyshev et al., "MBE Growth Of High Quality Metamorphic HEMT Structures On GaAs", 4 pages.

J. J. Dudley et al., "Low Threshold, Wafer Fused Long Wavelength Vertical Cavity Lasers", Appl. Phys. Lett., vol. 64, No. 12, Mar. 21, 1994, pp. 1463–1465.

J. J. Dudley et al., "144° C Operation Of 1.3 $\mu$m InGaAsP Vertical Cavity Lasers On GaAs Substrates", Appl. Phys. Lett., vol. 61 (26), Dec. 28, 1992, pp. 3095–3097.

(List continued on next page.)

Primary Examiner—James Davie
(74) Attorney, Agent, or Firm—Bever, Hoffman & Harms, LLP; James E. Parsons

(57) ABSTRACT

A light-emitting device includes a GaAs substrate, a light-emitting structure disposed above the substrate and capable of emitting light having a wavelength of about 1.3 microns to about 1.55 microns, and a buffer layer disposed between the substrate and the light-emitting structure. The composition of the buffer layer varies through the buffer layer such that a lattice constant of the buffer layer grades from a lattice constant approximately equal to a lattice constant of the substrate to a lattice constant approximately equal to a lattice constant of the light-emitting structure. The light-emitting device exhibits improved mechanical, electrical, thermal, and optical properties compared to similar light-emitting devices grown on InP substrates.

25 Claims, 3 Drawing Sheets

OTHER PUBLICATIONS

C. L. Chua et al., "Dielectrically–Bonded Long Wavelength Vertical Cavity Laser On GaAs Substrates Using Strain–Compensated Multiple Quantum Wells", IEEE Photonics Technology Letters, vol. 6, No. 12, Dec. 1994, pp. 1400–1403.

Dubravko I. Babić et al., "Room–Temperature Continuous–Wave Operation of 1.54–μm Vertical–Cavity Lasers", IEEE Photonics Technolgoy Letters, vol. 7, No. 11, Nov. 1995, pp. 1225–1227.

L. Goldstein, "GaAlAs/GaAs Metamorphic Bragg Mirror For Long Wavelength VCSEL's", Electronics Letters, vol. 34, No. 3, Feb. 5, 1998, pp. 268–270.

K. A. Black et al., "Long Wavelength Vertical Cavity Lasers", pp. 2–7.

* cited by examiner

LONG WAVELENGTH LASER DIODES ON METAMORPHIC BUFFER MODIFIED GALLIUM ARSENIDE WAFERS

BACKGROUND OF THE INVENTION

1. Field of the Invention

The present invention relates generally to light-emitting semiconductor devices capable of emitting light having a wavelength of about 1.3 microns to about 1.55 microns. More particularly, the present invention relates to such light-emitting devices incorporating metamorphic buffer layers.

2. Description of the Related Art

The telecommunications industry desires light sources capable of emitting light having a wavelength of about 1.3 microns to about 1.55 microns. These wavelengths correspond, respectively, to minimum dispersion and minimum loss in conventional glass optical fibers and would thus enable improved long distance and high speed optical communication.

Edge emitting and vertical cavity surface emitting lasers (VCSELs) that include active regions fabricated from indium-containing semiconductor material systems of appropriate composition, such as InGaAsP and AlInGaAs material systems, are capable of operating at 1.3 microns and 1.55 microns. Such active regions, however, typically cannot be grown lattice-matched to GaAs. Growth of such indium-containing materials on GaAs typically results in dislocations and other crystal defects that degrade the performance of the device. Consequently, light-emitting semiconductor devices capable of emitting light at about 1.3 microns to about 1.55 microns are typically grown lattice-matched to InP substrates. Unfortunately, InP substrates are generally smaller, more expensive, and more fragile than GaAs substrates.

In addition, VCSELs typically include one or more distributed Bragg reflectors (DBRs) designed to reflect light emitted by the active region. The Bragg reflectors provide optical feedback to the active region. Unfortunately, DBRs formed from material systems that can be lattice-matched to InP typically perform poorly compared to conventional GaAs/AlAs DBRs lattice-matched to GaAs.

What is needed is a light-emitting device integrating a semiconductor structure capable of emitting light having a wavelength of about 1.3 microns to about 1.55 microns with a GaAs substrate.

SUMMARY

A light-emitting device in accordance with an embodiment of the present invention includes a GaAs substrate, a light-emitting structure disposed above the substrate and capable of emitting light having a wavelength of about 1.3 microns to about 1.55 microns, and a buffer layer disposed between the substrate and the light-emitting structure. The composition of the buffer layer varies through the buffer layer such that a lattice constant of the buffer layer grades from a lattice constant of the substrate to a lattice constant of the light-emitting structure.

The buffer layer comprises $In_xAl_{1-x}As$ with $0 \leq x \leq 1$, in one embodiment. Such a buffer layer is formed, for example, by supplying to the substrate a flux of aluminum, a flux of arsenic, and a flux of indium, and varying a ratio of the flux of aluminum and the flux of indium as the buffer layer grows. In one implementation, the substrate is maintained at a temperature between about 380° C. and about 420° C. while the buffer layer is formed.

In one embodiment, the light-emitting device further includes a GaAs/AlAs distributed Bragg reflector disposed between the substrate and the buffer layer. In this embodiment, the composition of the buffer layer varies such that a lattice constant of the buffer layer grades from a lattice constant of the distributed Bragg reflector, typically lattice-matched to the GaAs substrate, to a lattice constant of the light-emitting structure.

In another embodiment, the light-emitting device includes a second GaAs/AlAs distributed Bragg reflector and a second buffer layer. The composition of the second buffer layer varies such that a lattice constant of the second buffer layer grades from a lattice constant of the light-emitting structure to a lattice constant of the second distributed Bragg reflector.

Light-emitting devices in accordance with embodiments of the present invention may exhibit improved mechanical, electrical, thermal, and/or optical properties compared to similar light-emitting devices grown on InP substrates.

It should be noted that the dimensions in the figures are not necessarily to scale.

DETAILED DESCRIPTION

Figure 1:
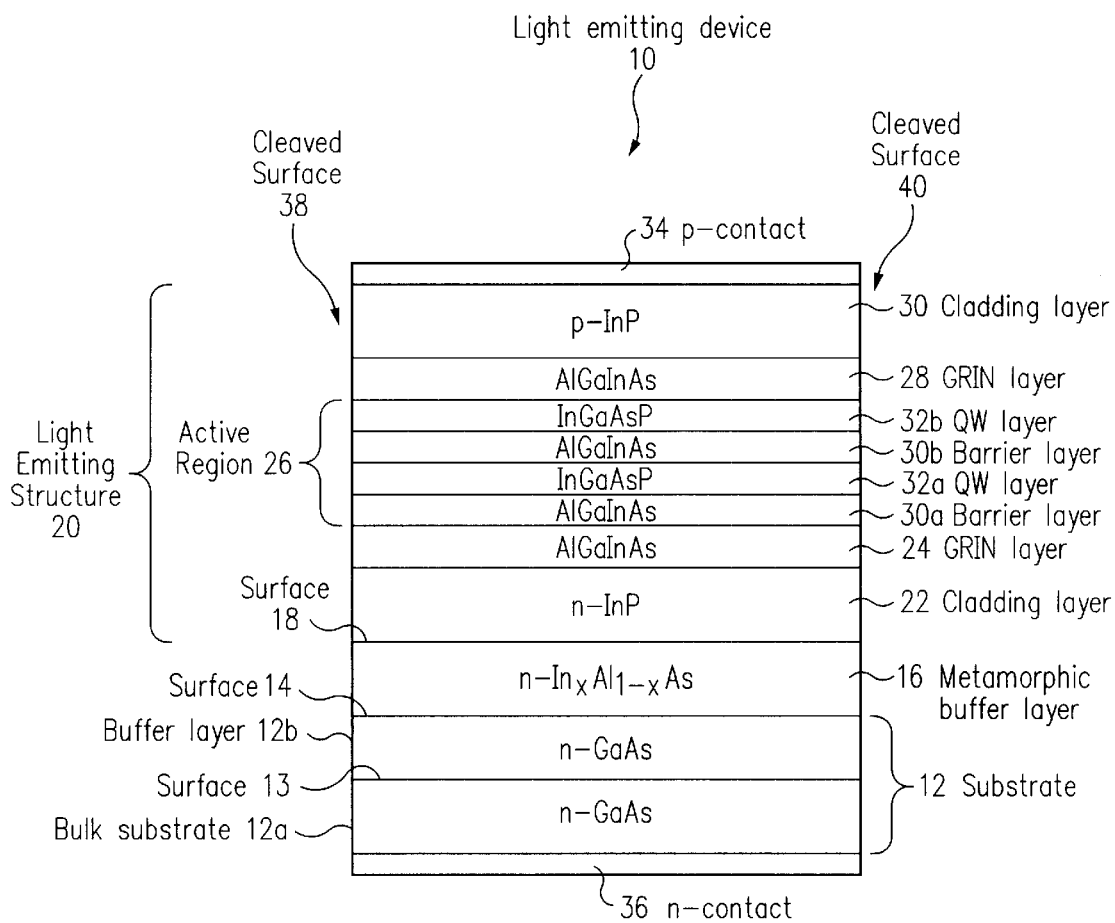
FIG. 1 is a schematic diagram of a light-emitting device including a metamorphic buffer layer in accordance with an embodiment of the present invention.

Referring to FIG. 1, a light-emitting device 10 in accordance with one embodiment of the present invention includes a GaAs substrate 12 having an upper surface 14, a metamorphic buffer layer 16 disposed above surface 14, and a light-emitting structure 20 disposed above surface 18 of metamorphic buffer layer 16.

In the implementation shown in FIG. 1, GaAs substrate 12 includes bulk GaAs substrate 12a and GaAs buffer layer 12b grown on surface 13 of bulk GaAs substrate 12a by molecular beam epitaxy (MBE) in a V90 molecular beam epitaxy system manufactured by VG Semicon of East Grinstead, United Kingdom. Other commercially available MBE systems suitable for growth of III–V material systems may also be used. Suitable bulk GaAs substrate wafers are commercially available from a variety of sources. Bulk GaAs substrate 12a is positioned in the MBE apparatus and heated under an arsenic flux to a temperature of about 650° C. to remove surface oxides. GaAs buffer layer 12b is subsequently grown on surface 13 from gallium and arsenic sources at a substrate temperature between about 550° C. and about 620° C. GaAs buffer layer 12b is typically about 100 Angstroms (Å) to about 1000 Å thick.

Both bulk GaAs substrate 12a and GaAs buffer layer 12b are conventionally doped to n-type conductivity in the implementation shown in FIG. 1, but may be undoped or conventionally doped to p-type conductivity in other implementations. Surface 13 of bulk GaAs substrate 12a is, for example, a (100) crystal surface or a (100) crystal surface miscut by about 2° to about 8°.

The composition of metamorphic buffer layer 16 varies with distance from surface 14 such that a lattice constant of metamorphic buffer layer 16 grades from a lattice constant of GaAs substrate 12 to a lattice constant of an indium-containing material in light-emitting structure 20. Strain in metamorphic buffer layer 16 resulting from its varying composition is relaxed by dislocations. The gradation of the composition of metamorphic buffer layer 16 is chosen to be sufficiently gradual, however, that the defect density in metamorphic buffer layer 16 is low and that few dislocations and other defects propagate through metamorphic buffer layer 16 to surface 18.

One of ordinary skill in the art will recognize that metamorphic buffer layer 16 supporting light-emitting structure 20 should have fewer than about $10^4$ defects (dislocations, for example) per square centimeter ($cm^2$) at surface 18. A surface defect density greater than about $10^4/cm^2$ at surface 18 could significantly degrade the performance of light emitting structure 20. In contrast, one of ordinary skill in the art will recognize that metamorphic buffer layers used in the fabrication of high electron mobility transistors (HEMTS) typically have surface defect densities as high as about $10^6/cm^2$ and are thus typically unsuitable for use in light-emitting devices.

The inventors have measured surface defect densities of, for example, $In_xAl_{1-x}As$ metamorphic buffer layers prepared in accordance with the present invention by preferentially etching the defects with a conventional decoration etch, imaging the etched surfaces with an optical microscope, and counting the defects. The inventors have discovered that such metamorphic buffer layers prepared in accordance with the present invention have defect densities less than about $10^4/cm^2$, and are thus suitable for use in light-emitting devices.

In the implementation shown in FIG. 1, metamorphic buffer layer 16 comprises $In_xAl_{1-x}As$ ($0 \leq x \leq 1$) grown on surface 14 of GaAs substrate 12 by molecular beam epitaxy in the same MBE apparatus in which GaAs buffer layer 12b was grown. In this implementation, metamorphic buffer layer 16 is grown from indium, aluminum, and arsenic sources at a substrate temperature between about 380° C. and about 420° C., preferably about 400° C. At temperatures lower than about 380° C., metamorphic buffer layer 16 may incorporate excess arsenic and consequently develop numerous defects. At temperatures higher than about 420° C., migration of indium may induce defects that roughen surface 18.

Metamorphic buffer layer 16 is electrically conductive. Metamorphic buffer layer 16 is conventionally doped to n-type conductivity in the implementation shown in FIG. 1, but may be undoped or conventionally doped to p-type conductivity in other implementations.

A metamorphic buffer layer 16 comprising $In_xAl_{1-x}As$ typically has a thickness of about 1500 Angstroms to about 2 microns ($\mu$m).

A desired composition profile in metamorphic buffer layer 16 is achieved by controlling the flux of precursor materials to GaAs substrate 12 during the growth process. During the MBE growth of $In_xAl_{1-x}As$ metamorphic buffer layer 16 shown in FIG. 1, for example, the flux of arsenic is held constant and the ratio of the flux of aluminum and the flux of indium is varied such that the mole fraction of indium varies from about x=0 near surface 14 to about x=0.53 near surface 18. As the indium mole fraction increases, indium atoms replace aluminum atoms in the crystal lattice of metamorphic buffer layer 16. Hence, metamorphic buffer layer 16 is nominally lattice-matched to GaAs substrate 12 near surface 14 and nominally lattice-matched to n-InP cladding layer 22 of light-emitting structure 20 near surface 18. One of ordinary skill in the art will recognize that the mole fraction of indium in an $In_xAl_{1-x}As$ metamorphic buffer layer 16 may also vary to nominally lattice match, near surface 18, other III–V alloys of indium such as alloys of indium with aluminum, gallium, arsenic, phosphorous, or combinations thereof.

The mole fraction of indium in an $In_xAl_{1-x}As$ metamorphic buffer layer 16 may vary monotonically in a linear or exponential manner, for example, between surface 14 and surface 18. Alternatively, the mole fraction of indium may vary in a nonmonotonic manner. For example, the mole fraction of indium may increase from about x=0 near surface 14 to a value $x_1$ at a position intermediate between surfaces 14 and 18 and then decrease to a value $x_2 < x_1$ near surface 18. In addition, the mole fractions of indium and aluminum in an $In_xAl_{1-x}As$ metamorphic buffer layer 16 may vary smoothly or in a step wise manner in steps having a thickness of about 100 Å to about 1000 Å.

Light-emitting structure 20 is a conventional indium-containing light-emitting structure capable of emitting light having a wavelength of about 1.3 microns to about 1.55 microns. The present invention is independent of the detailed structure of light-emitting structure 20. Many such conventional structures are known in the art.

Metamorphic buffer layer 16 allows light-emitting structure 20 to be integrated with inexpensive and mechanically robust GaAs substrate 12 in light-emitting device 10. Light-emitting structure 20 may be grown on surface 18 of metamorphic buffer layer 16 by molecular beam epitaxy in the same apparatus in which metamorphic buffer layer 16 is grown. Alternatively, light-emitting structure 20 may be grown, for example, by chemical vapor deposition or metal-organic chemical vapor deposition.

In the implementation shown in FIG. 1, light-emitting structure 20 includes n-type InP cladding layer 22 grown on and nominally latticed matched to metamorphic buffer layer 16. Above cladding layer 22 are grown, in sequence, AlGaInAs graded index (GRIN) layer 24, active region 26, AlGaInAs GRIN layer 28, and p-type InP cladding layer 30. Active region 26 includes an alternating sequence of AlGaInAs barrier layers (30a and 30b) and AlGaInAs or InGaAsP quantum well layers (32a and 32b). For convenience of illustration, FIG. 1 shows 2 quantum well layers and 2 barrier layers. In other implementations, light-emitting structure 20 includes from 1 to about 10 quantum well layers and a corresponding number of barrier layers.

After the growth of light-emitting structure 20, conventional p-contact 34 and conventional n-contact 36 are deposited, respectively, on cladding layer 22 and GaAs substrate 12.

Application of a suitable forward bias across p-contact 34 and n-contact 36 results in injection of electrons and holes into active region 26. Radiative recombination of electrons and holes in quantum wells 30a and 30b generates light having a wavelength of about 1.3 to about 1.55 microns. In one implementation, light-emitting device 10 is an edge emitting laser in which conventionally cleaved mirror surfaces 38 and 40 reflect a portion of the light generated in active region 26, thereby providing optical feedback to active region 26. Another portion of the light generated in active region 26 is emitted through mirror surfaces 38 and 40 to form an optical output of light-emitting device 10.

Figure 2:
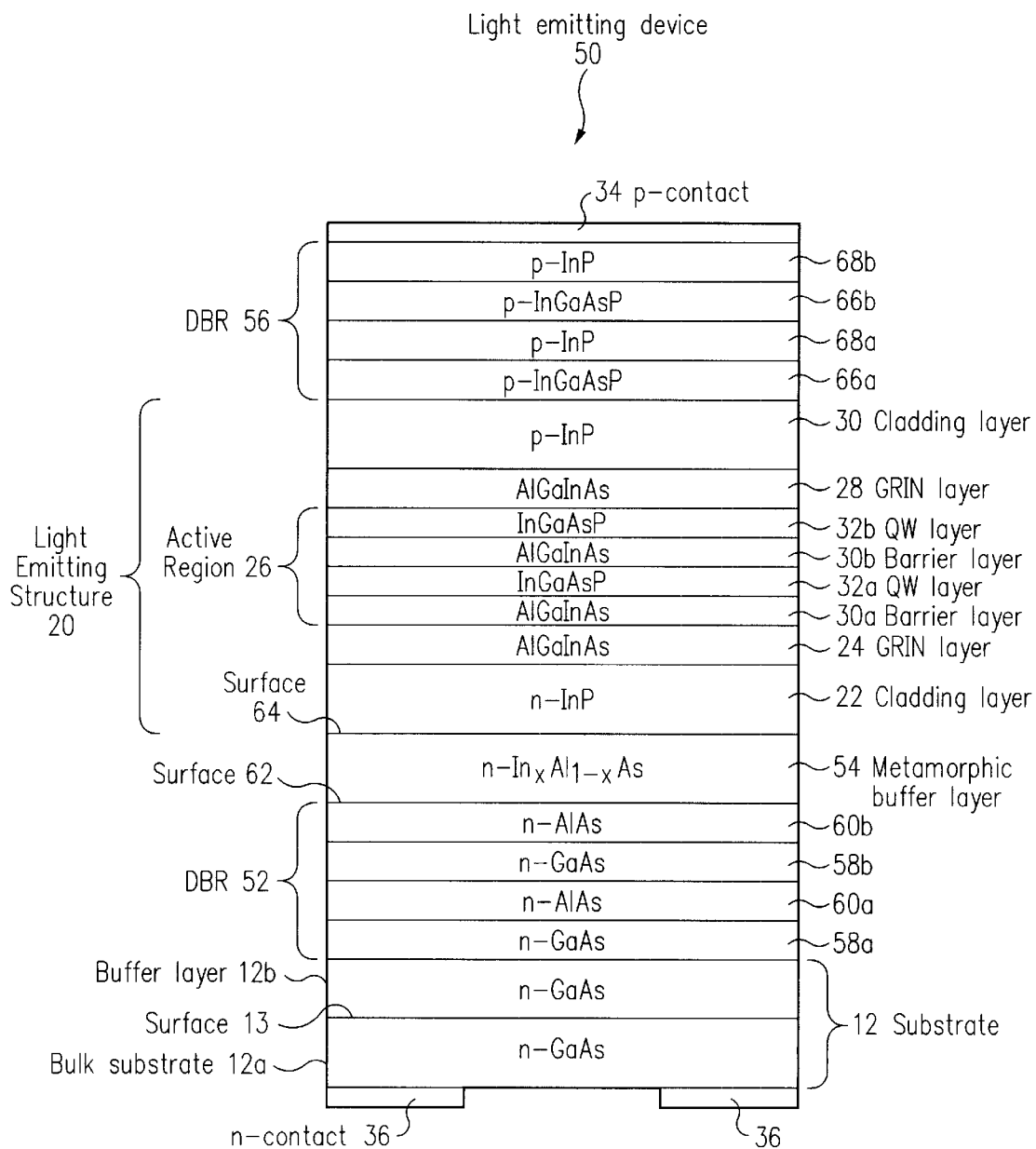
FIG. 2 is a schematic diagram of a light-emitting device including a metamorphic buffer layer and a distributed Bragg reflector in accordance with another embodiment of the present invention.

Referring to FIG. 2, a light-emitting device 50 in accordance with another embodiment of the present invention includes, in sequence, GaAs substrate 12, a first conventional distributed Bragg reflector (DBR) 52, a metamorphic buffer layer 54, conventional light-emitting structure 20, and a second conventional DBR 56. Like reference numbers in the various figures designate same parts in the various embodiments.

Conventional DBR 52 includes an alternating sequence of GaAs layers (58a and 58b) and AlAs layers (60a and 60b) grown lattice-matched to GaAs substrate 12 by molecular beam epitaxy, for example. Each layer in DBR 52 has a thickness of about one quarter of a wavelength of light generated in active region 26 of light-emitting structure 20. Hence, DBR 52 is typically highly reflective to light having a wavelength of about 1.3 microns to about 1.55 microns. DBR 52 is doped to n-type conductivity in the implementation shown in FIG. 2, but may be undoped or conventionally doped to p-type conductivity in other implementations. Such conventional GaAs/AlAs DBRs are well known in the art.

Though for convenience of illustration FIG. 2 shows only two pairs of GaAs and AlAs layers, DBR 52 typically includes from about 20 to about 40 such pairs. One of ordinary skill in the art will recognize that the reflectivity of a DBR, such as DBR 52, increases with the number of paired layers it includes.

The performance of light-emitting device 50 is improved by the inclusion of GaAs/AlAs DBR 52 rather than a DBR formed from an InP based material lattice-matched to light-emitting structure 20. In particular, GaAs/AlAs DBR 52 exhibits a higher reflectivity for a fewer number of paired layers, a higher thermal conductance, and a lower series resistance than does such an InP based DBR.

Metamorphic buffer layer 54 grown on surface 62 of DBR 52 is substantially similar to metamorphic buffer layer 16 of the previous embodiment. In particular, metamorphic buffer layer 54 has a composition which varies with distance from surface 62 such that a lattice constant of metamorphic buffer layer 54 grades from a lattice constant of DBR 52 (lattice-matched to GaAs substrate 12) to a lattice constant of an indium-containing material in light-emitting structure 20. Thus, metamorphic buffer layer 54 allows light-emitting structure 20 and GaAs/AlAs DBR 52 to be integrated in light-emitting device 50. Metamorphic buffer layer 54 may be grown, for example, by molecular beam epitaxy in the same apparatus in which DBR 52 is grown. In the particular example of FIG. 2, metamorphic buffer layer 54 comprises $In_xAl_{1-x}As$ nominally lattice-matched to DBR 52 near surface 62 and nominally lattice-matched to n-InP cladding layer 22 near surface 64.

Metamorphic buffer layer 54 is preferably substantially transparent to light having a wavelength of about 1.3 to about 1.55 microns. A metamorphic buffer layer 54 comprising $In_xAl_{1-x}As$, for example, is suitably transparent for $x<0.4$.

Conventional DBR 56 is also typically highly reflective to light having a wavelength of about 1.3 to about 1.55 microns. In the implementation shown in FIG. 2, DBR 56 is a conventional InGaAsP/InP DBR including an alternating sequence of one quarter wavelength thick InGaAsP layers (66a and 66b) and InP layers (68a and 68b) grown lattice-matched to p-InP cladding layer 30 by molecular beam epitaxy, for example. DBR 56 is conventionally doped to p-type conductivity in the implementation shown in FIG. 2, but may be undoped or conventionally doped to n-type conductivity in other implementations. Such conventional InGaAsP/InP DBRs are well known in the art. Though for convenience of illustration FIG. 2 shows only two pairs of InGaAsP and InP layers, DBR 56 typically includes more than 20 such pairs.

After the growth of DBR 56, conventional p-contact 34 and conventional n-contact 36 are deposited, respectively, on DBR 56 and GaAs substrate 12.

Application of a suitable forward bias across contacts 34 and 36 results in generation of light having a wavelength of about 1.3 microns to about 1.55 microns in active region 26. DBRs 52 and 56 reflect a portion of the light generated in active region 26, thereby providing optical feedback to active region 26. Another portion of the light generated in active region 26 is emitted through one or both of DBRs 52 and 56 to form an optical output of light-emitting device 50. In one implementation, light-emitting device 50 is a vertical cavity surface emitting laser (VCSEL).

Figure 3:
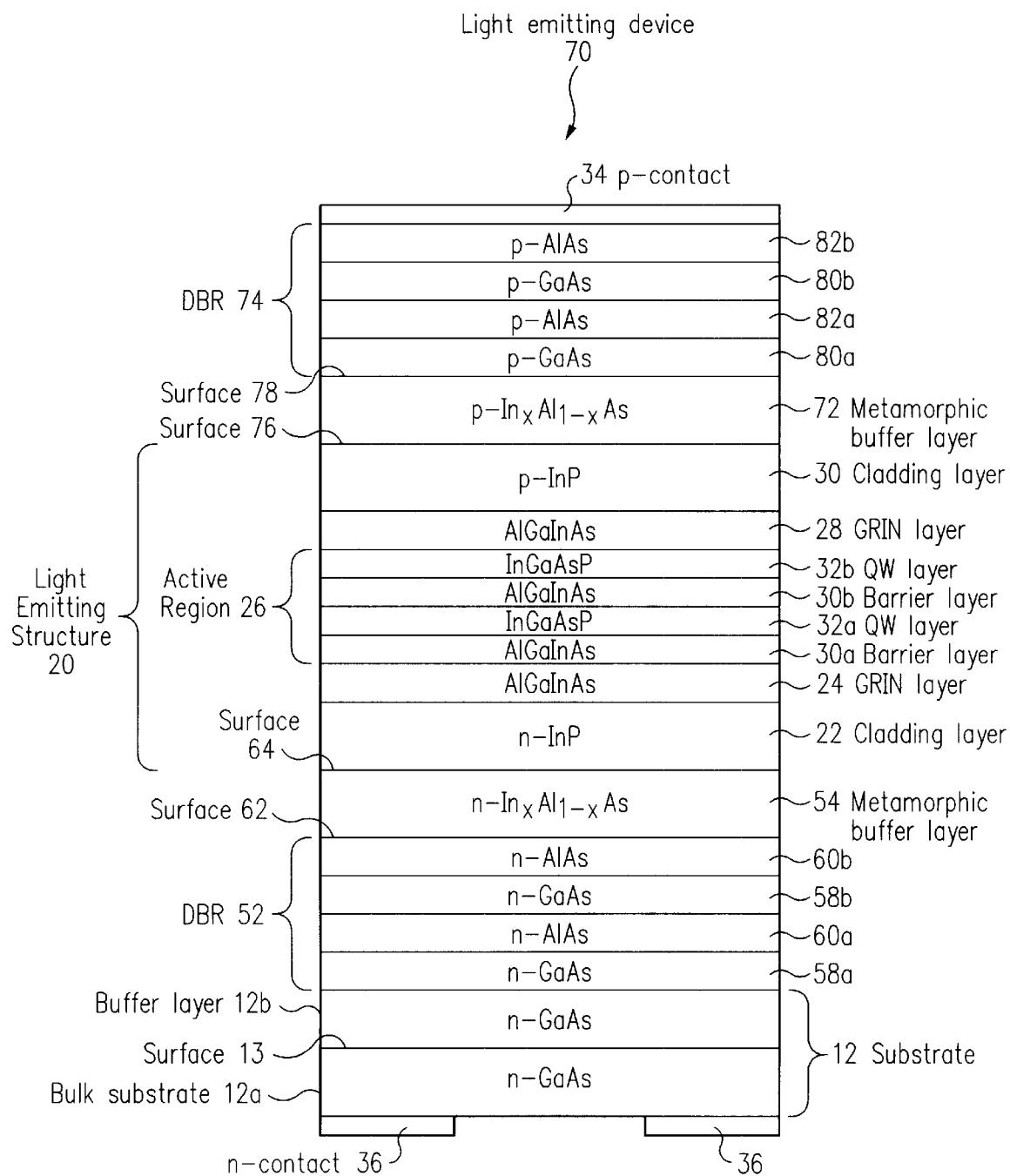
FIG. 3 is a schematic diagram of a light-emitting device including two metamorphic buffer layers in accordance with another embodiment of the present invention.

Referring to FIG. 3, a light-emitting device 70 in accordance with another embodiment of the present invention includes, in sequence, GaAs substrate 12, first conventional distributed Bragg reflector (DBR) 52, metamorphic buffer layer 54, conventional light-emitting structure 20, a second metamorphic buffer layer 72, and a second conventional DBR 74.

Metamorphic buffer layer 72 grown on surface 76 of p-InP cladding layer 30 is substantially similar to metamorphic buffer layers 16 and 54 of the previous embodiments. In particular, metamorphic buffer layer 72 has a composition which varies with distance from surface 76 such that a lattice constant of metamorphic buffer layer 72 grades from a lattice constant of an indium-containing material in light-emitting structure 20 to a lattice constant of an AlAs or GaAs layer in DBR 74. Hence, metamorphic buffer layer 72 allows light-emitting structure 20 and GaAs/AlAs DBR 74 to be integrated in light-emitting device 70. Metamorphic buffer layer 72 may be grown, for example, by molecular beam epitaxy. In the particular example of FIG. 2, metamorphic buffer layer 72 comprises $In_xAl_{1-x}As$ nominally lattice-matched to p-InP cladding layer 30 near surface 76 and nominally lattice-matched to DBR 74 near surface 78.

DBR 74 is substantially similar to or identical to DBR 52 and provides similar advantages. In particular, DBR 74 includes an alternating sequence of GaAs layers (80a and 80b) and AlAs layers (82a and 82b) grown by MBE, for example, on surface 78 of metamorphic buffer layer 72. DBR 74 is typically highly reflective to light having a wavelength of about 1.3 to about 1.55 microns. DBR 74 is doped to p-type conductivity in the implementation shown in FIG. 3, but may be undoped or conventionally doped n-type conductivity in other implementations. Though for convenience of illustration FIG. 3 shows only two pairs of GaAs and AlAs layers, DBR 74 typically includes from about 20 to about 40 such pairs.

After the growth of DBR 74, conventional p-contact 34 and conventional n-contact 36 are deposited, respectively, on DBR 74 and GaAs substrate 12.

Light-emitting device 70 operates in a manner substantially similar to that of light-emitting device 50.

While the present invention is illustrated with particular embodiments, the invention is intended to include all variations and modifications falling within the scope of the appended claims.

We claim:

1. A light-emitting device comprising:
   a gallium arsenide substrate;
   a light-emitting structure disposed above said substrate; and a buffer layer disposed between said substrate and said light-emitting structure;

wherein a composition of said buffer layer varies through said buffer layer such that a lattice constant of said buffer layer continuously grades from a lattice constant approximately equal to a lattice constant of said substrate to a lattice constant approximately equal to a lattice constant of said light-emitting structure.

2. The light-emitting device of claim 1, wherein said buffer layer comprises $In_xAl_{1-x}As$ with $0 \leq x \leq 1$.

3. The light-emitting device of claim 2, wherein $x \leq 0.53$.

4. The light-emitting device of claim 1, wherein a thickness of said buffer layer is about 1500 Angstroms to about 2 microns.

5. The light-emitting device of claim 1, wherein a mole fraction of an element in said buffer layer varies exponentially through said buffer layer.

6. The light-emitting device of claim 1, wherein a mole fraction of an element in said buffer layer varies linearly through said buffer layer.

7. The light-emitting device of claim 1, wherein said light-emitting structure comprises a laser.

8. The light-emitting device of claim 1, wherein said light-emitting structure comprises an indium-containing material lattice-matched to InP.

9. The light-emitting device of claim 1, further comprising a distributed Bragg reflector.

10. The light-emitting device of claim 9, wherein said distributed Bragg reflector comprises alternating layers of gallium arsenide and aluminum arsenide.

11. The light-emitting device of claim 9, wherein said distributed Bragg reflector is disposed between said substrate and said buffer layer.

12. The light-emitting device of claim 9 wherein said buffer layer is a first buffer layer, further comprising a second buffer layer disposed between said light-emitting structure and said distributed Bragg reflector, wherein a composition of said second buffer layer varies through said second buffer layer such that a lattice constant of said second buffer layer continuously grades from a lattice constant approximately equal to a lattice constant of said light-emitting structure to a lattice constant approximately equal to a lattice constant of said distributed Bragg reflector.

13. The light-emitting device of claim 12, wherein said continuous grading of said lattice constant of said second buffer layer comprises a linear or exponential grading from a lattice constant approximately equal to a lattice constant of said light-emitting structure to a lattice constant approximately equal to a lattice constant of said distributed Bragg reflector.

14. The light-emitting device of claim 1, wherein the light-emitting structure is capable of emitting light having a wavelength of about 1.3 microns to about 1.55 microns.

15. A light-emitting device comprising:

a substrate comprising gallium arsenide;

a first distributed Bragg reflector overlying the substrate;

a light-emitting structure overlying the distributed Bragg reflector; and a first metamorphic buffer layer between the first distributed Bragg reflector and the light-emitting structure, wherein a lattice constant of the first metamorphic buffer layer grades from approximately a lattice constant of a top layer of the first distributed Bragg reflector to approximately a lattice constant of a bottom layer of the light-emitting structure.

16. The light-emitting structure of claim 15, wherein the top layer of the first distributed Bragg reflector comprises arsenic, and wherein the bottom layer of the light-emitting structure comprises indium.

17. The light-emitting device of claim 15 further comprising:

a second distributed Bragg reflector overlying the light-emitting structure, the second distributed Bragg reflector comprising indium; and a second metamorphic buffer layer between the light-emitting structure and the second distributed Bragg reflector, wherein a lattice constant of the second metamorphic buffer layer grades from approximately a lattice constant of a top layer of the light-emitting structure to approximately a lattice constant of a bottom layer of the second distributed Bragg reflector.

18. The light-emitting device of claim 17, wherein the top layer in the light-emitting structure comprises indium, and wherein the bottom layer in the second distributed Bragg reflector comprises indium.

19. The light-emitting device of claim 17, wherein the first distributed Bragg reflector comprises alternating layers of gallium arsenide (GaAs) and aluminum arsenide (AlAs), and wherein the second distributed Bragg reflector comprises alternating layers of indium gallium arsenide phosphide (InGaAsP) and indium phosphide (InP).

20. The light-emitting device of claim 17, wherein the lattice constant of the second metamorphic buffer layer varies continuously and monotonically.

21. The light-emitting device of claim 15 further comprising:

a second distributed Bragg reflector overlying the light-emitting structure, the second distributed Bragg reflector comprising at least one gallium arsenide layer; and a second metamorphic buffer layer between the light-emitting structure and the second distributed Bragg reflector, wherein a lattice constant of the second metamorphic buffer layer grades from approximately a lattice constant of a top layer of the light-emitting structure to approximately a lattice constant of a bottom layer of the second distributed Bragg reflector.

22. This light emitting device of claim 21, wherein the top layer of the light-emitting structure comprises indium, and wherein the bottom layer of the second distributed Bragg reflector comprises arsenic.

23. The light-emitting device of claim 21, wherein the first and second distributed Bragg reflectors comprise alternating layers of gallium arsenide (GaAs) and aluminum arsenide (AlAs).

24. The light-emitting device of claim 21, wherein the lattice constant of the second metamorphic buffer layer varies continuously and monotonically.

25. The light-emitting device of claim 15, wherein the lattice constant of the first metamorphic buffer layer varies continuously and monotonically.

* * * * *

UNITED STATES PATENT AND TRADEMARK OFFICE
CERTIFICATE OF CORRECTION

PATENT NO. : 6,697,412 B2
DATED : February 24, 2004
INVENTOR(S) : Edward A. Beam III It is certified that error appears in the above-identified patent and that said Letters Patent is hereby corrected as shown below:

Column 8,
Line 47, replace the word "This" with -- The --.

Signed and Sealed this

Tenth Day of August, 2004

JON W. DUDAS
*Acting Director of the United States Patent and Trademark Office*